(12) United States Patent  
Karstetter

(10) Patent No.: US 8,402,640 B2  
(45) Date of Patent: Mar. 26, 2013

(54) ALIGNMENT AND LEAD INSERTION DEVICE FOR AN ELECTRONIC COMPONENT

(75) Inventor: Brian Karstetter, San Jose, CA (US)

(73) Assignee: Vectronix, Inc., Leesburg, VA (US)

( * ) Notice: Subject to any disclaimer, the term of this patent is extended or adjusted under 35 U.S.C. 154(b) by 16 days.

(21) Appl. No.: 13/245,345

(22) Filed: Sep. 26, 2011

(65) Prior Publication Data

US 2012/0073127 A1 Mar. 29, 2012

Related U.S. Application Data

(60) Provisional application No. 61/404,123, filed on Sep. 28, 2010.

(51) Int. Cl.  
*H05K 13/04* (2006.01)
(52) U.S. Cl. .......................................... 29/741; 29/760
(58) Field of Classification Search .................. 29/729, 29/739, 760, 757, 759, 741  
See application file for complete search history.

(56) References Cited

U.S. PATENT DOCUMENTS 4,875,966 A * 10/1989 Perko ............................ 156/580

* cited by examiner

*Primary Examiner* — Livius R Cazan  
(74) *Attorney, Agent, or Firm* — Opticus IP Law PLLC

(57) ABSTRACT

An opposing first plate and second plate are slideably disposed with respect to each other using self-aligning plate registration means. Circuit board registration means and component registration means are provided for the initial X-Y alignment and registration of the circuit board and socket contact elements with one or more electrically conductive leads of an electronic component such as a focal plane array (FPA). A non-contact portion is provided on the first plate to eliminate plate contact with the first component surface which may comprise the lens of an FPA. The first and second plates are urged together such that an even, controlled and substantially planar compressive force is applied, permitting the efficient insertion of the electrically conductive leads into the socket contacts.

10 Claims, 3 Drawing Sheets

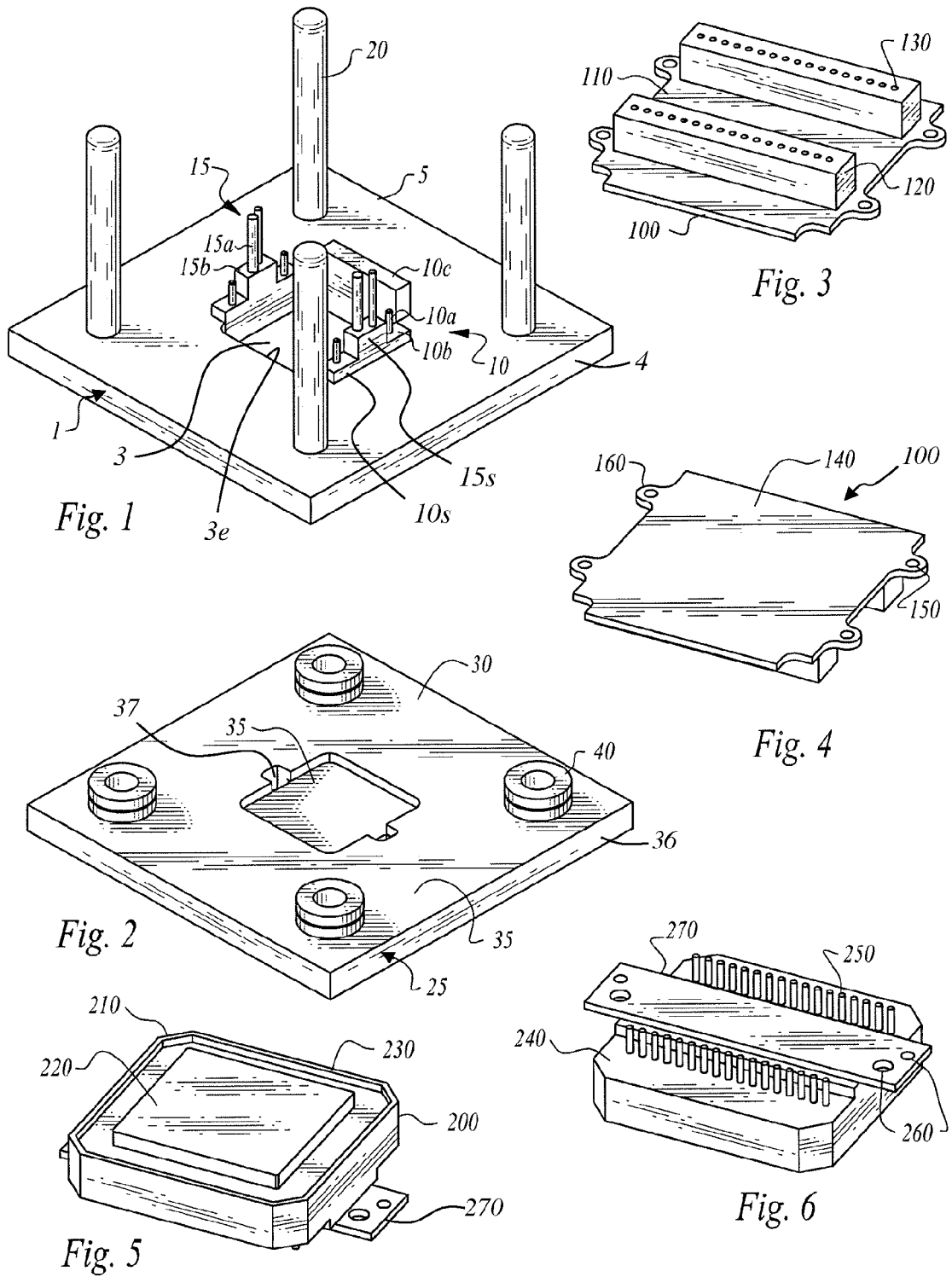

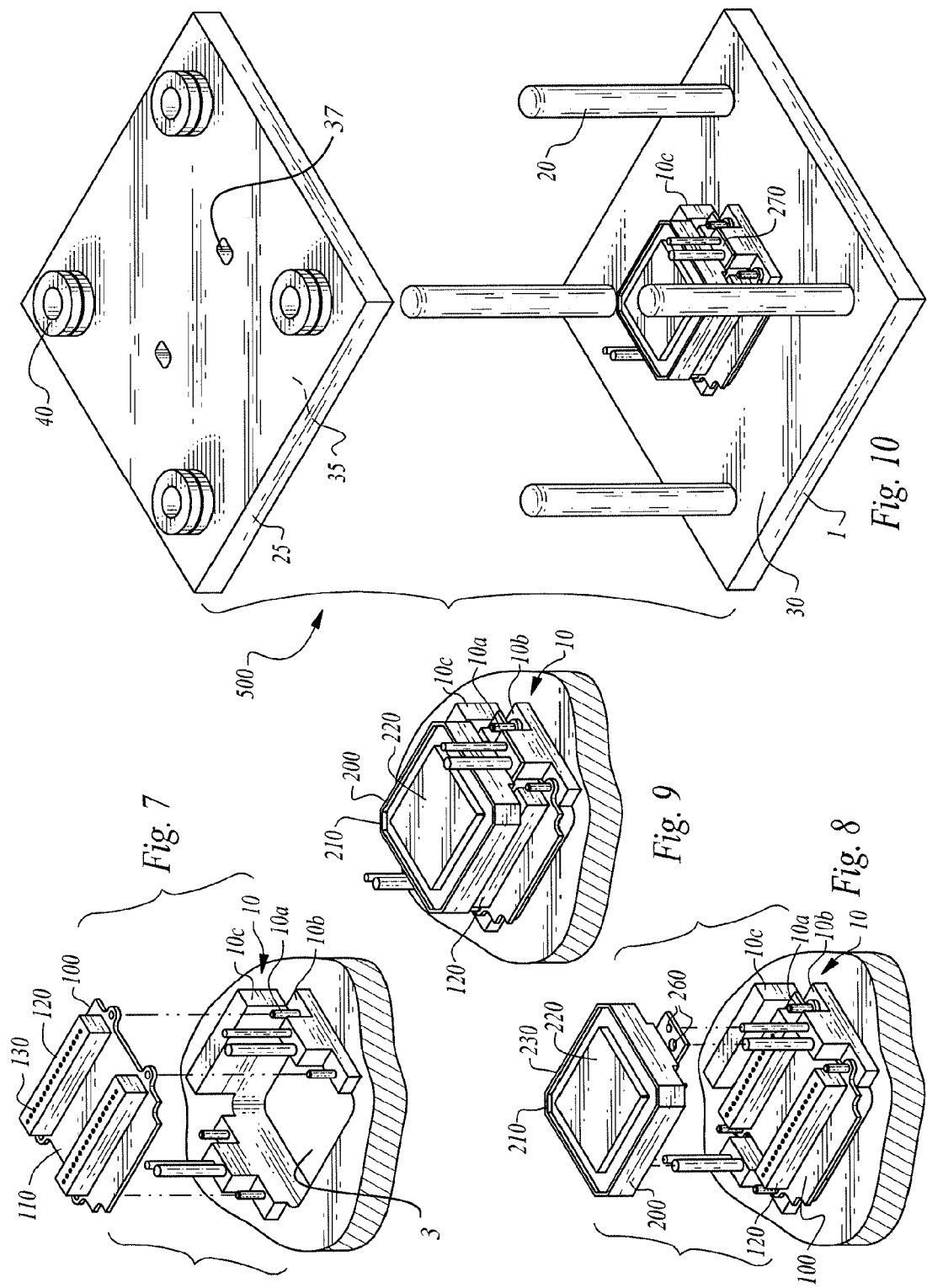

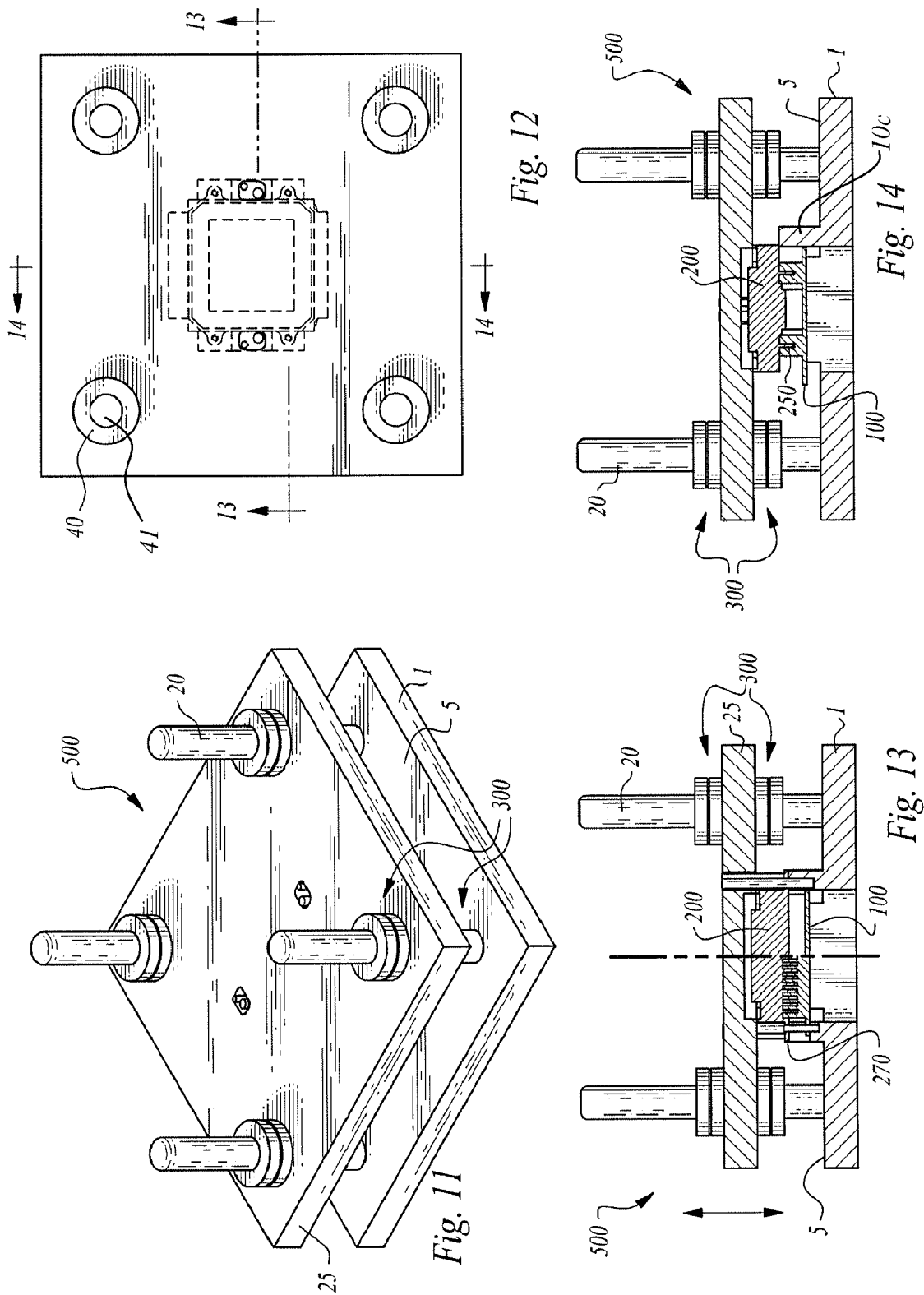

ALIGNMENT AND LEAD INSERTION DEVICE FOR AN ELECTRONIC COMPONENT

CROSS-REFERENCE TO RELATED APPLICATIONS

This application claims the benefit of U.S. Provisional Patent Application No. 61/404,123, filed on Sep. 28, 2010 entitled "Alignment and Lead Insertion Device for an Electronic Component" pursuant to 35 USC 119, the entirety of which is incorporated herein by reference.

STATEMENT REGARDING FEDERALLY SPONSORED RESEARCH AND DEVELOPMENT

N/A

BACKGROUND OF THE INVENTION

1. Field of the Invention

The invention relates generally to the field of tools and fixtures used in electronic assembly. More specifically, the invention relates to a device for the alignment and insertion of the leads of a leaded electronic component such as a focal plane array into the electrical contacts of an electronic socket connector.

2. Description of the Related Art

Electronic component packages are often provided with input/output electrically conductive leads for connecting the packages integrated circuit chip or device to external circuitry or connector assembly. The leads may be delicate, small and prone to breakage such that bending and misalignment can occur during the assembly process when the leads are inserted into the contacts of, for instance, an electronic socket connector. An example of such an electronic component is a focal plane array (or "FPA") comprising an array of microbolometer pixel elements and a lens on a first component surface and comprising a set of one or more outwardly depending electrically conductive leads on a second component surface.

Because FPA components may be relatively fragile and expensive, minimizing damage to the component leads during assembly is paramount. To that end, Applicant discloses herein an electronic component installation device such as may be used as a focal plane array installation device for the efficient installation of a component such as a focal plane array lead set into an electronic socket connector as generally described below.

BRIEF SUMMARY OF THE INVENTION

An opposing first plate and second plate are slideably disposed with respect to each other using self-aligning plate registration means. Circuit board registration means and component registration means are provided for the initial X-Y alignment and registration of the circuit board-mounted socket contact elements with one or more component leads of an electronic component such as an FPA.

A non-contact portion is defined on the first plate to eliminate plate contact with a predetermined portion of the first component surface which may comprise the lens area of an FPA. In application, a circuit board and component are registered with respect to each other using circuit and component registering means and the first and second plates are urged together. In this manner, an even, controlled and substantially planar compressive force is applied to the first component surface without the chance of lens damage, permitting the efficient insertion of the component leads of and FPA into the socket contacts.

In a first aspect of the invention, a device for the alignment and inserting of the lead of an electronic component is disclosed comprising a first plate, a second plate, self-aligning plate registration means for aligning and slideably disposing the first plate with respect to the second plate, circuit board registration means and component registration means.

In a second aspect of the invention, the self-aligning plate registration means comprises a guide rail and a self-aligning bearing.

In a third aspect of the invention, at least one of the first and second plates comprises a non-contact portion.

In a fourth aspect of the invention, the circuit board registration means comprises a circuit board registration pin having a first cross-sectional dimension.

In a fifth aspect of the invention, the component registration means comprises a component registration pin having a second cross-sectional dimension.

These and various additional aspects, embodiments and advantages of the present invention will become immediately apparent to those of ordinary skill in the art upon review of the Detailed Description the drawing figures and the claims that follow.

While the claimed apparatus and method herein has or will be described for the sake of grammatical fluidity with functional explanations, it is to be understood that the claims, unless expressly formulated under 35 USC 112, are not to be construed as necessarily limited in any way by the construction of "means" or "steps" limitations, but are to be accorded the full scope of the meaning and equivalents of the definition provided by the claims under the judicial doctrine of equivalents, and in the case where the claims are expressly formulated under 35 USC 112, are to be accorded full statutory equivalents under 35 USC 112.

BRIEF DESCRIPTION OF THE SEVERAL VIEWS OF THE DRAWINGS

FIG. 1 depicts the first plate, circuit board registration means, component registration means and a plurality of cylindrical guide rails of the device of the invention.

FIG. 2 depicts the second plate of the invention and comprising a non-contact area and a plurality of self-aligning bearings.

FIG. 3 depicts a first circuit board surface comprising a plurality of electronic socket connector elements.

FIG. 4 depicts a second circuit board surface with a plurality of circuit board registration holes disposed on the circuit board flanges thereof.

FIG. 5 depicts a first electronic component surface, depicted as a focal plane array comprising a lens element.

FIG. 6 depicts a second electronic component surface, depicted as a focal plane array having a plurality of outwardly depending electrically conductive leads and further comprising a plurality of component registration holes disposed on the component flange thereof.

FIG. 7 depicts the circuit board being received by the circuit board registration pins of the first plate.

FIG. 8 depicts the focal plane array being received by the component registration pins of the first plate.

FIG. 9 depicts the leads of the focal plane array fully inserted into and received by the contact inserts of the socket connector elements.

FIGS. 10 and 11 are orthographic projections of the device of the invention depicting the second plate slideably disposed with respect to the first plate in a first position and second position respectively by means of a plurality of guide rails and self-aligning bearings.

FIG. 12 is a plan view of FIG. 11 illustrating the orientation of the elements of invention.

FIG. 13 is a section taken along 13-13 of FIG. 12.

FIG. 14 is a section taken along 14-14 of FIG. 12.

The invention and its various embodiments can now be better understood by turning to the following detailed description of the preferred embodiments which are presented as illustrated examples of the invention defined in the claims. It is expressly understood that the invention as defined by the claims may be broader than the illustrated embodiments described below.

Turning now to the figures wherein like numerals depict like elements among the several views, an alignment and lead insertion device for an electronic component is disclosed.

FIG. 1 depicts the first plate 1 of the invention. First plate surface 5 may comprise circuit board registration means 10 that includes a circuit board stage 10s, component registration means 15 that includes a component stage 15s, and a plurality of cylindrical guide rails 20. First plate 1 includes a central aperture 3 that in an example is generally rectangular. Central aperture 3 defines an inside edge 3e. First plate 1 also has an outer perimeter (edge) 4. The cylindrical guide rails 20 are upwardly depending and are arranged between the central aperture 3 and the outside perimeter 4. In an example, first plate 1 includes four guide rails 20 as shown.

Circuit board registration means 10 may comprise a plurality of upwardly depending circuit board registration pins 10a having a first cross-sectional dimension, a circuit board stage surface 10b and a standoff member 10c. The elements 10a, 10b and 10c of circuit board registration means 10 are preferably configured to orient and receive a circuit board in a predetermined alignment and orientation such that a circuit board cannot be installed in an incorrect orientation, i.e., backwards or upside down.

Component registration means 15 may comprise a plurality of upwardly depending component registration pins 15a having a second cross-sectional dimension and a component stage surface 15b. Component registration elements 15a and 15b of component registration means 15 are preferably configured to orient and receive an electronic component in a predetermined alignment and orientation such that a component cannot be installed in an incorrect orientation., i.e., backwards or upside down. Component registration pins 15a may comprise one or more sets of differently sized component registration pins. As best seen in FIG. 1, in an example, component stage 15s upwardly depends from a central portion of circuit board stage 10s so that component stage surface 15b is farther away from first plate surface 5 than circuit board stage surface 10b, and so that the component registration pins 15a reside between (i.e., are in board of) the circuit board registration pins 10a. Also in an example, two circuit board stages 10s and component stages 15s are arranged in opposition (i.e., they face each other) across central aperture 3 from opposite sides of the central aperture and are arranged immediately adjacent inside edge 3e.

FIG. 2 depicts the second plate 25 of the invention. Second plate surface 30 may comprise a non-contact area 35 at a predetermined position and having a predetermined non-contact area set of dimensions and a plurality of self-aligning bearings 40 that each define an aperture 41 (see FIG. 12). Non-contact area 35 may comprise a window, aperture, recessed portion or void in second plate surface 30 whereby, when the second plate surface 30 is urged against the surface of an electronic component, a predetermined portion of the electronic component surface, such as the lens of an FPA, is not in direct contact with second plate surface 30. Second plate 25 includes an outer perimeter (edge) 36. Non-contact area 35 includes guide holes 37 on the periphery of the non-contact area and that are aligned with and sized to receive component registration elements (pins) 15a, as shown in FIGS. 10 and 11.

FIG. 3 depicts a circuit board 100 having a first circuit board surface 110 comprising a plurality of electronic socket connector elements 120, each of which comprises a plurality of individual electrical contacts 130.

FIG. 4 depicts a second circuit board surface 140 with a plurality of circuit board registration holes 150 disposed on the circuit board flanges 160 thereof.

FIG. 5 depicts an electronic component 200 having first electronic component surface 210, here a focal plane array comprising a lens 220 and a periphery 230.

FIG. 6 depicts a second component surface 240 of electronic component 200 having outwardly depending electrically conductive leads 250 with a plurality of component registration holes 260 disposed on the component flange 270 thereof. Component registration holes 260 are configured to receive component registration pins 15a.

By maintaining tight tolerances and "fit" of the various elements of the stage heights and registration pin and registration hole dimensions of the circuit board and electronic component, precise alignment of the circuit board and electronic component leads can be established.

The use of the device of the invention to align and install an electronic component in, for instance, an electronic socket connector is now discussed.

Turning to FIG. 7, circuit board registration holes 150 are aligned with and receive circuit board registration pins 10a whereby the second circuit board surface 150 is in contact with circuit board stage surface 15b.

FIG. 8 depicts the component registration holes 260 next being aligned with and receiving component registration pins 15a.

FIG. 9 depicts the leads of the focal plane array 200 fully inserted into the electrical contacts 130 of the electronic socket connector elements 120 after the first and second plates have been urged together with a compressive force. In this manner, electrically conductive leads 250 are fully received to a predetermined depth by the electrical contacts 130 of the electronic socket connector elements 120. In this configuration, the component stage surface 15b acts as a "stop" to prevent electrically conductive leads 250 from being inserted too far or too forcefully which would risk breaking or damaging one or more elements of component 200.

FIGS. 10 and 11 are orthographic projections of the alignment and insertion device of the invention 500 depicting second plate 25 slideably disposed with respect to the first plate 1 in a first "beginning" position illustrated in FIG. 10 and a second "installed" position of FIG. 11 by means of the cooperation of a plurality of guide rails 20 and self-aligning bearings 40. The receiving of the guide rails 20 by the self-aligning bearings 40 permits precision travel of the plates with respect to each other during the assembly process.

The planes defined by the first plate surface and the second plate surface are preferably maintained so as to remain substantially parallel with each other along the plate's path of travel during the component installation process.

The function and cooperation of the self-aligning bearings 40 and cylindrical guide rails 20 define self-aligning plate registration means 300. Guide rails 20 and self-aligning bearings 40 may be interchangeably disposed in or on the first or second plates of the invention and are preferably configured where one or more shared rail/bearing axis are "off-set" or differently sized such that the respective first and second plates can be only be assembled in a single orientation.

Self-aligning bearings 40 may each comprise two rows of ball bearings and a common, concave sphered raceway in an outer ring such as available from SKF Group. As the result of the cooperation of the bearings and the raceway, the bearings are self-aligning and insensitive to angular misalignments of the guide rail relative to the bearing housing. The self-aligning bearing is particularly suitable for applications where considerable shaft deflections or misalignment may to be expected. Additionally, the self-aligning bearing has lower friction.

FIG. 12 is a plan view of FIG. 11 illustrating the orientation of the elements of invention and reflects the registration pin elements of the circuit board and electronic component received within the respective registration holes.

FIG. 13 is a section taken along 13-13 of FIG. 12 and shows the circuit board 100 in contact with the circuit board stage surface 10b and the FPA component 200 in contact with the component stage surface 15b, the configuration of each of which defines a predetermined depth of travel of the first plate with respect to the second plate to prevent the over-insertion of electrically conductive leads 250 into socket element 120.

FIG. 14 is a section taken along 14-14 of FIG. 12 and shows the circuit board 100 in contact with the circuit board stage surface 10b and the FPA component 200 in contact with the component stage surface 15b, the configuration of each of which defines a predetermined depth of travel of the first plate with respect to the second plate to prevent the over-insertion of leads 250 into socket element 120.

Many alterations and modifications may be made by those having ordinary skill in the art without departing from the spirit and scope of the invention. Therefore, it must be understood that the illustrated embodiment has been set forth only for the purposes of example and that it should not be taken as limiting the invention as defined by any claims in any subsequent application claiming priority to this application.

For example, notwithstanding the fact that the elements of such a claim may be set forth in a certain combination, it must be expressly understood that the invention includes other combinations of fewer, more or different elements, which are disclosed in above even when not initially claimed in such combinations.

The words used in this specification to describe the invention and its various embodiments are to be understood not only in the sense of their commonly defined meanings, but to include by special definition in this specification structure, material or acts beyond the scope of the commonly defined meanings. Thus, if an element can be understood in the context of this specification as including more than one meaning, then its use in a subsequent claim must be understood as being generic to all possible meanings supported by the specification and by the word itself.

The definitions of the words or elements of any claims in any subsequent application claiming priority to this application should be, therefore, defined to include not only the combination of elements which are literally set forth, but all equivalent structure, material or acts for performing substantially the same function in substantially the same way to obtain substantially the same result. In this sense, it is therefore contemplated that an equivalent substitution of two or more elements may be made for any one of the elements in such claims below or that a single element may be substituted for two or more elements in such a claim.

Although elements may be described above as acting in certain combinations and even subsequently claimed as such, it is to be expressly understood that one or more elements from a claimed combination can in some cases be excised from the combination and that such claimed combination may be directed to a subcombination or variation of a subcombination.

Insubstantial changes from any subsequently claimed subject matter as viewed by a person with ordinary skill in the art, now known or later devised, are expressly contemplated as being equivalently within the scope of such claims. Therefore, obvious substitutions now or later known to one with ordinary skill in the art are defined to be within the scope of the defined elements.

Any claims in any subsequent application claiming priority to this application are thus to be understood to include what is specifically illustrated and described above, what is conceptually equivalent, what can be obviously substituted and also what essentially incorporates the essential idea of the invention.

I claim:

1. A device for aligning and inserting leads of an electronic component having component registration holes into socket connector elements of a circuit board having circuit board registration holes, comprising:
    a first plate having a perimeter and a central aperture that defines an inside edge;
    first and second circuit board stages arranged adjacent to and on opposite sides of the central aperture, with each circuit board stage having a circuit board stage surface from which upwardly depends a pair of spaced-apart circuit board registration pins that align with a pair of the circuit board registration holes;
    first and second component stages that respectively upwardly depend from central portions of the first and second circuit board stages, wherein each of the first and second component stages has a component stage surface from which upwardly depends a pair of spaced apart component registration pins that reside between the circuit board registration pins and that align with a pair of the component registration holes; and
    a plurality of upwardly-depending guide rails arranged between the central aperture and the perimeter of the first plate.

2. The device of claim 1, wherein the central aperture is rectangular and wherein the first and second component stages reside on opposite first and second sides of the rectangular central aperture.

3. The device of claim 1, further comprising a standoff member adjacent to the rectangular central aperture on a third side of the rectangular central aperture.

4. The device according to claim 3, further comprising:
    the electronic component having on one side a lens and a perimeter and on an opposite side a plurality of leads, the electronic component being operably arranged on the first plate with the component registration pins extending through corresponding component registration holes so that the lens faces upwards and the plurality of leads downwardly depend so that they are generally aligned with and extend at least partially into the plurality of electrical contacts of the circuit board.

5. The device according to claim 4, further comprising:
    a second plate having a surface with a central non-contact area having a periphery and;
    a pair of guide holes residing at the periphery and each configured to align with and engage a pair of the component registration pins;
    a plurality of apertures configured to align with and slidingly engage the guide rails of the first plate; and wherein the second plate is interfaced with and urged together with the first plate with the guide rails extending through respective apertures and the component registration pins extending through the guide holes so that the non-contact area is adjacent to but not in contact with the lens of the component and with the surface of the contact plate contacting the perimeter of the component to urge the plurality of leads of the component further into the electrical contacts of the circuit board.

6. The device according to claim 4, wherein the component comprises a focal plane array.

7. The device according to claim 4, wherein the leads of the electronic component and the electrical contacts of the circuit board are each arranged in parallel rows.

8. The device of claim 1, wherein each pair of component registration guide pins has first and second component registration guide pins that have different diameters.

9. The device according to claim 8, wherein the first and second component registration guide pins are offset relative to the inside edge of the rectangular central aperture.

10. The device according to claim 1, further comprising:
the circuit board operably arranged on the first plate, with the circuit board registration pins extending through corresponding circuit board registration holes, wherein the circuit board includes a plurality of upwardly facing electrical contacts.

* * * * *